(12) United States Patent
Choi

(10) Patent No.: US 10,727,004 B2
(45) Date of Patent: Jul. 28, 2020

(54) TWO-DIMENSIONAL TRANSITION METAL DICHALCOGENIDE MICRO-SUPERCAPACITORS

(71) Applicant: UNIVERSITY OF NORTH TEXAS, Denton, TX (US)

(72) Inventor: Wonbong Choi, Coppell, TX (US)

(73) Assignee: University of North Texas, Denton, TX (US)

( * ) Notice: Subject to any disclaimer, the term of this patent is extended or adjusted under 35 U.S.C. 154(b) by 0 days.

(21) Appl. No.: 16/091,474

(22) PCT Filed: Apr. 7, 2017

(86) PCT No.: PCT/US2017/026659
§ 371 (c)(1),
(2) Date: Oct. 4, 2018

(87) PCT Pub. No.: WO2017/177168
PCT Pub. Date: Oct. 12, 2017

(65) Prior Publication Data
US 2019/0139713 A1    May 9, 2019

Related U.S. Application Data

(60) Provisional application No. 62/319,329, filed on Apr. 7, 2016, provisional application No. 62/394,580, filed on Sep. 14, 2016.

(51) Int. Cl.
*H01G 11/86* (2013.01)
*C01G 39/06* (2006.01)
(Continued)

(52) U.S. Cl.
CPC .............. *H01G 11/86* (2013.01); *B32B 15/04* (2013.01); *C01G 39/06* (2013.01); *C23C 14/14* (2013.01); *C23C 14/35* (2013.01); *C23C 16/305* (2013.01); *H01G 4/085* (2013.01); *H01G 4/33* (2013.01); *H01G 11/28* (2013.01); *H01G 11/30* (2013.01); *H01L 21/2855* (2013.01); *H01L 21/28556* (2013.01); *H01L 21/30604* (2013.01); *H01L 29/401* (2013.01); *H01L 29/458* (2013.01);
(Continued)

(58) Field of Classification Search
None
See application file for complete search history.

(56) References Cited

U.S. PATENT DOCUMENTS

| 2012/0156424 | A1 | 6/2012 | Chen |
| 2014/0205756 | A1* | 7/2014 | Law .................... H01L 31/1864 |
| | | | 427/374.1 |

(Continued)

FOREIGN PATENT DOCUMENTS

WO    WO-2015/102746 A2    7/2015

OTHER PUBLICATIONS

International Search Report and Written Opinion issued for PCT Application No. PCT/US2016/056601 dated Aug. 7, 2017; 17 pages.

*Primary Examiner* — Alexander G Ghyka
(74) *Attorney, Agent, or Firm* — Norton Rose Fulbright US LLP

(57) ABSTRACT

The invention includes supercapacitors and methods of making supercapacitor by fabricating transition metal dichalcogenide ($MX_2$) layers using a combination of magnetron sputtering followed by chemical vapor deposition.

17 Claims, 8 Drawing Sheets

A

B                C

(51) Int. Cl.
  *H01G 11/30*    (2013.01)
  *B32B 15/04*    (2006.01)
  *H01G 4/33*     (2006.01)
  *H01G 4/08*     (2006.01)
  *C23C 14/14*    (2006.01)
  *C23C 14/35*    (2006.01)
  *C23C 16/30*    (2006.01)
  *H01G 11/28*    (2013.01)
  *H01L 21/285*   (2006.01)
  *H01L 21/306*   (2006.01)
  *H01L 29/40*    (2006.01)
  *H01L 29/45*    (2006.01)
  *H01L 29/66*    (2006.01)

(52) U.S. Cl.
  CPC .... *H01L 29/66772* (2013.01); *C01P 2002/85* (2013.01); *C01P 2006/40* (2013.01); *Y02E 60/13* (2013.01)

(56) References Cited

U.S. PATENT DOCUMENTS

| | | | |
|---|---|---|---|
| 2014/0245946 A1* | 9/2014 | Kong | C30B 25/186 |
| | | | 117/95 |
| 2015/0116906 A1* | 4/2015 | Thevasahayam | H01G 11/28 |
| | | | 361/502 |
| 2016/0093491 A1 | 3/2016 | Choi et al. | |

* cited by examiner

4A

4B

4C

TWO-DIMENSIONAL TRANSITION METAL DICHALCOGENIDE MICRO-SUPERCAPACITORS

TECHNICAL FIELD

The present invention relates in general to the field of supercapacitors, and more particularly, to film-type supercapacitors and manufacturing methods thereof.

BACKGROUND ART

Without limiting the scope of the invention, its background is described in connection with film-type supercapacitors. Lithium thin-film batteries have been developed but when compared to general lithium batteries their charging performance per volume is worse and their production costs are much more costly. As a result, it is difficult to apply them to bio-application fields such as artificial organs, prosthesis and micro-robots.

A supercapacitor may be used as an energy storage means and may replace the lithium batteries as a next-generation energy storage device that can be quickly charged and discharged within several seconds, provides 10 times higher power than rechargeable batteries, and provides a semi-permanent lifetime over 500,000 cycles. The energy storage level per volume is more important for a very small electronic device that is light in weight so the film-type micro-supercapacitor as a power supply means that it is very appropriate for the very small electronic device. The energy storage of the supercapacitor per weight is substantially equivalent to 1/10 that of conventional batteries and the energy storage level thereof per volume is similar to that of the lithium batteries, and recent reports say that the supercapacitor outperforms the existing batteries regarding energy density and power density per volume.

In addition, film-type micro-supercapacitors do not use rare earth metals so it is inexpensive and environmentally friendly. Film-type micro-supercapacitors do not generate oxidation-reduction reaction that may result in explosive characteristics.

U.S. Pat. No. 8,951,306, entitled, "Film-type supercapacitor and manufacturing method thereof" discloses a film-type micro-supercapacitor and a manufacturing method thereof including a method for manufacturing an electrode film by using graphene or graphene oxide, a method for forming a two-dimensional electrode by separating a graphene or graphene oxide electrode film into two independent electrodes through patterning, a method for forming an in-plane structure of the two-dimensional electrode, a method for forming a current collector on an electrode, and a method for manufacturing a supercapacitor with a micrometer thickness by supplying an electrolyte to the two-dimensional electrode.

U.S. Patent Application Publication No. 2013/0217289, entitled, "Super capacitor thread, materials and fabrication method" teaches a one-dimensional super capacitor thread with a thin conductive wire electrode. An active layer of silicon nanoparticles and polyaniline surrounds the electrode. An electrolyte layer surrounds the active layer. The electrolyte layer can be a layer of polyvinyl alcohol (PVA). A super capacitor can be formed with two or more of the threads, such as in a twisted pair configuration. The dimensions of the super capacitor can approximate standard threads used in clothing, for example.

U.S. Pat. No. 9,048,029, entitled, "Flexible conducting polymer energy storage device" discloses an electrochemical redox supercapacitor. The supercapacitor includes two thin films of electrically conducting polymer separated by an ion-permeable membrane and including an electrolyte disposed between the two thin films. Electrical contacts are disposed on outer surfaces of the two thin films. The supercapacitor is flexible and may be rolled, folded on itself, or kept substantially flat. The entire contents of which are incorporated herein by reference.

DISCLOSURE OF INVENTION

The invention provides design and fabrication method of micro-supercapacitors based on two-dimensional film. Two dimensional (2D) layered materials may be used as an efficient flexible energy storage for wearable electronics due to their unique structure. The present invention provides a new approach of fabricating flexible and high-capacitance 2D materials based supercapacitor electrode fabricated directly by using direct-deposition technique. The fabricated 2D materials based electrode exhibits stable and strong adhesion to the substrate. The optimized $MoS_2$-based supercapacitor shows an excellent capacitive behavior with a high capacitance and the volumetric power and energy density. This supercapacitor electrode also exhibited an excellent cyclic stability along with a low equivalent series resistance (ESR) of only a few ohms. The flexible and high performance 2D materials-based supercapacitor brings new design opportunities for an efficiency wearable electronic devices.

The present invention provides a method of making a layered $MoS_2$ supercapacitor by forming into a supercapacitor by: providing a substrate; providing a Molybdenum source; using a magnetron to induce a plasma to generate Molybdenum ions from the Molybdenum source; sputtering the Molybdenum ions on the substrate to form a thin layer of Molybdenum; placing the substrate in a CVD chamber; providing a sulphur source; forming a sulphur vapor from the sulphur source, wherein the sulphur vapor is in communication with the CVD chamber; and sulphurizing the thin layer of Molybdenum to form a thin layer of Molybdenum disulfide $MoS_2$.

The present invention provides a method of making a thin layer transition metal dichalcogenide ($MX_2$) supercapacitor comprising the steps of: forming into a supercapacitor by: providing a substrate; providing a transition metal source; using a magnetron to induce a plasma to generate transition metal ions; sputtering the transition metal ions on the substrate to form a thin layer of transition metal; placing the substrate in a CVD chamber; providing a chalcogen source; forming a chalcogen vapor from the chalcogen source in communication with the CVD chamber; and contacting the chalcogen vapor with the thin layer of transition metal to form a thin layer transition metal dichalcogenide ($MX_2$). The transition metal may be Mo, W, or Nb. The chalcogen may be S, Se, or Te. The transition metal dichalcogenide may be $MoS_2$, $MoSe_2$, $MoTe_2$ $_2$, $WS_2$, $WSe_2$, $WTe_2$, $NbS_2$, $NbSe_2$, or $NbTe_2$. The thin layer of transition metal may be 1, 2, 3, 4, 5, 6, 7, 8, 9, 10, 11, 12, 13, 14, 15, 16, 17, 18, 19, 20, 21, 22, 23, 24, 25, 26, 27, 28, 29, 30 or more layers thick. The transition metal dichalcogenide may be 1, 2, 3, 4, 5, 6, 7, 8, 9, 10, 11, 12, 13, 14, 15, 16, 17, 18, 19, 20, 21, 22, 23, 24, 25, 26, 27, 28, 29, 30 or more layers thick. The one or more parameters of the magnetron may be controlled to apply 2, 3, 4, 5, 6, 7, 8, 9, 10, 11, 12, 13, 14, 15, 16, 17, 18, 19, 20, 21, 22, 23, 24, 25, 26, 27, 28, 29, 30 or more layers of the transition metal. A second transition metal can be added to form a second thin layer on the thin layer, wherein the second transition metal is Mo, W, or Nb. The substrate may be a Si/SiO$_2$ substrate. The magnetron may use a RF power source to creating plasma. The temperature of the substrate may be at a temperature of between room temperature –800° C.

The present invention provides a method of making a MoS$_2$ supercapacitor, by providing a substrate; forming an electrode film on the substrate by: providing a Molybdenum source; using a magnetron to induce a plasma to generate Molybdenum ions from the Molybdenum source; sputtering the Molybdenum ions on the substrate to form a thin layer of Molybdenum; placing the substrate in a CVD chamber; providing a sulphur source; forming a sulphur vapor from the sulphur source, wherein the sulphur vapor is in communication with the CVD chamber; and sulphurizing the thin layer of Molybdenum to form a thin layer of Molybdenum disulfide MoS$_2$ on the substrate; forming a current collector on both sides of an electrode film; forming two separated electrodes by patterning the electrode film with an in-plane structure; and reinforcing a bonding portion of the electrode film and the current collector through metal plating. An electrolyte may be added to the manufactured supercapacitor and may be one of a water-soluble electrolyte, an organic electrolyte, an ionic liquid electrolyte, and a solid electrolyte is used for the electrolyte.

The present invention provides a method of forming a thin film field effect transistor (FET) device, comprising: providing a silicon-on-insulator substrate; etching a single crystal silicon thin film layer on an insulating thin film layer of the silicon-on-insulator substrate, wherein the etched single crystal silicon thin film layer is used as a channel; forming a gate insulating layer on the silicon-on-insulator substrate that has the single crystal silicon channel formed thereon; and forming a gate electrode, a drain electrode, and a source electrode by providing a substrate; providing a transition metal source; inducing a plasma using a magnetron; generating transition metal ions using the plasma; sputtering the transition metal ions on the substrate to form a thin layer of transition metal; placing the substrate in a CVD chamber; providing a chalcogen source; forming a chalcogen vapor in communication with the CVD chamber; and contacting the chalcogen vapor with the thin layer of transition metal to form a thin layer of transition metal dichalcogenide (MX$_2$). The transition metal (M) may be Mo, W, or Nb and the chalcogen (X$_2$) may be S, Se, or Te. The transition metal dichalcogenide may be MoS$_2$, MoSe$_2$, MoTe$_2$, WS$_2$, WSe$_2$, WTe$_2$, NbS$_2$, NbSe$_2$, or NbTe$_2$.

DESCRIPTION OF DRAWINGS

For a more complete understanding of the features and advantages of the present invention, reference is now made to the detailed description of the invention along with the accompanying figures and in which:

FIG. 4C shows the possibility of large area deposition of MoS$_2$ films on flexible (polyimide) substrates.

FIG. 6C is an electrochemical impedance spectroscopy (EIS) image of MoS$_2$ thin film in the frequency range of 105 Hz to 0.1 Hz. Inset shows the high frequency region. FIG. 6D is an image of the charge-discharge profiles at different current density. Inset shows the 5000$^{th}$ cycle at a current density of 25.47 mA/cm$^2$.

DESCRIPTION OF INVENTION

Figure 1:
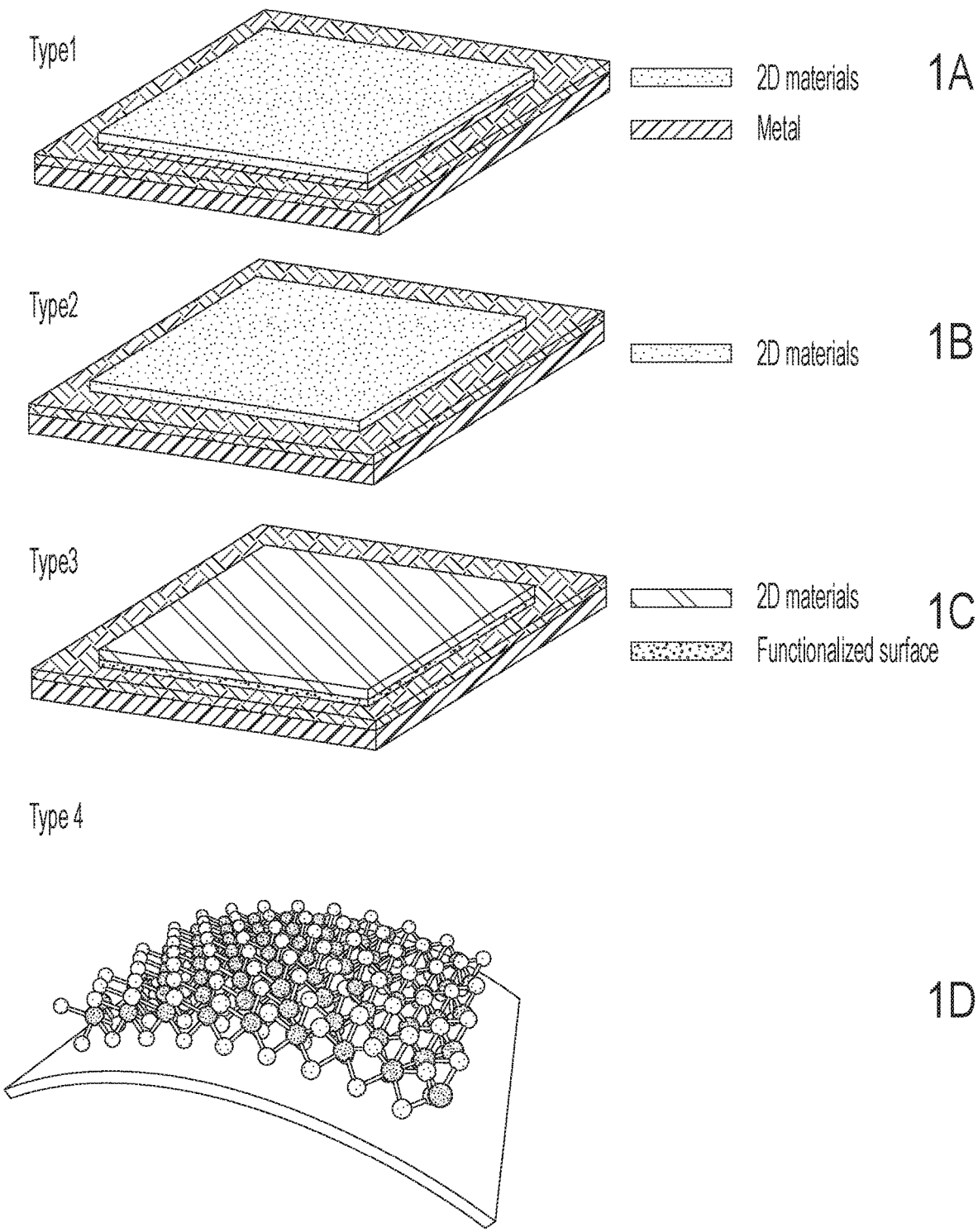
FIGS. 1A-1D are images of designs of 2D materials based electrode for supercapacitors.

While the making and using of various embodiments of the present invention are discussed in detail below, it should be appreciated that the present invention provides many applicable inventive concepts that can be embodied in a wide variety of specific contexts. The specific embodiments discussed herein are merely illustrative of specific ways to make and use the invention and do not delimit the scope of the invention.

To facilitate the understanding of this invention, a number of terms are defined below. Terms defined herein have meanings as commonly understood by a person of ordinary skill in the areas relevant to the present invention. Terms such as "a", "an" and "the" are not intended to refer to only a singular entity, but include the general class of which a specific example may be used for illustration. The terminology herein is used to describe specific embodiments of the invention, but their usage does not delimit the invention, except as outlined in the claims.

Spatially relative terms, such as "above," "below," "left," "right," "in front," "behind," and the like, may be used herein for ease of description to describe the relationship of one element to another element, as illustrated in the figures. It will be understood that the spatially relative terms, as well as the illustrated configurations, are intended to encompass different orientations of the apparatus in use or operation in addition to the orientations described herein and depicted in the figures. For example, if the apparatus in the figures is turned over, elements described as "below" or "beneath" other elements or features would then be oriented "above" the other elements or features. Thus, the exemplary term, "above," may encompass both an orientation of above and below. The apparatus may be otherwise oriented (e.g., rotated 90 degrees or at other orientations) and the spatially relative descriptors used herein interpreted accordingly.

Although the terms, first, second, third, etc., may be used herein to describe various elements, these elements are not to be limited by these terms. These terms are simply used to distinguish one element from another. Thus, a first element, discussed below, could be termed a second element without departing from the teachings of the exemplary embodiments.

Unless otherwise defined, used or characterized herein, terms that are used herein (including technical and scientific terms) are to be interpreted as having a meaning that is consistent with their accepted meaning in the context of the relevant art and are not to be interpreted in an idealized or overly formal sense unless expressly so defined herein. For example, if a particular composition is referenced, the composition may be substantially, though not perfectly pure, as practical and imperfect realities may apply; e.g., the potential presence of at least trace impurities (e.g., at less than 1 or 2%, wherein percentages or concentrations expressed herein can be either by weight or by volume) can be understood as being within the scope of the description; likewise, if a particular shape is referenced, the shape is intended to include imperfect variations from ideal shapes, e.g., due to manufacturing tolerances.

As used herein the term "transition metal dichalcogenide" is used to denote semiconductors of the type $MX_2$, with M a transition metal atom and X a chalcogen atom having a layered or monolayer structure where one layer of M atoms is sandwiched between two layers of X atoms. M may be molybdenum (Mo), tungsten (W), etc. and X may be sulfur (S), selenium (Se) and tellurium (Te), e.g., MoS2, $MoTe_2$, $MoSe_2$, $WS_2$, $WTe_2$, $WSe_2$, $TiS_2$, $TiTe_2$, $TiSe_2$ etc.

The most interesting feature of 2D materials like graphene and transition metal dichalcogenide materials is that the bulk of these materials are composed of layered structures with strong covalent bonding within each layer and weak van der Waals forces between the adjacent layers. Therefore, single or few-layer nanosheets of these materials can be obtained by using mechanical exfoliation using adhesive tapes. Graphene, while being fundamentally and technologically interesting for a variety of applications with remarkable electronic properties, e.g., its massless Dirac fermions has an effective speed of light vF≈$10^6$ $ms^{-1}$ and a room temperature mobility of 200,000 $cm^2V^{-1}s^{-1}$ in addition to its flexibility and high transparency. However, the absence of band gap in graphene leading to a very low ion/off ratio limits its broader use for applications in electronics like logic devices. With this consideration, TMDs, in particular, molybdenum disulphide ($MoS_2$) are great alternatives to graphene that offers a better solution of fabricating high performance electronic devices as they are intrinsic semiconductors and possess unique properties of quantum confinement and thickness-dependent band gap i.e., changing from 1.3 eV to 1.9 eV for bulk (indirect bandgap) and single layer (direct bandgap) $MoS_2$, respectively. Therefore, $MoS_2$ could complement graphene and find its unique applications in flexible electronics, high temperature and radiation hard electric and opto-electric devices. There have been several efforts in fabricating single layer (SL) $MoS_2$ using a mechanical exfoliation method but found a low value of mobility on $SiO_2$ substrates typically 0.01~10 $cm^2$ $V^{-1}s^{-1}$. Wang et al. studied mechanically exfoliated $MoS_2$ on $SiO_2$ and found the room temperature mobility of ~10 $cm^2V^{-1}s^{-1}$ for bilayer FETs, which are substantially lower than the measured 200 $cm^2V^{-1}s^{-1}$ of the bulk $MoS_2$. The very low mobility is believed to be due to the charge disorder caused by unwanted chemical bonding and/or roughness at the interfaces. However, the use of other gate dielectric materials likes $HfO_2$, $Al_2O_3$ by several research groups had demonstrated a much higher mobility values. But, the complicated process of exfoliating single-layer $MoS_2$ with an additional high-k dielectric layer may significantly limit its compatibility with commercial fabrication. Besides, the traditional mechanical exfoliation method lacks in the formation of large scale SL and few layers $MoS_2$ films limiting its use for widespread applications. Therefore, the large-scale synthesis of high-quality single or a few layers $MoS_2$ is still a challenge.

For synthesizing large area $MoS_2$ thin films, several research groups attempted a wide range of methods including thermal evaporation, van der Waals epitaxy (VDWE), sputtering, pulsed laser deposition (PLD), and electron beam evaporation (EBE). However, most of these techniques have been reported to produce $MoS_2$ in morphologies other than layered (e.g. nano particles, nanorods and nanotubes). This is mainly due the fact that such approaches produce many nucleation sites and the resultant film growth is initiated from these sites. Techniques like VDWE and molecular beam epitaxy (MBE), at very low vacuum and controlled deposition rates can produce ordered 2D layered structures, but they are rather expensive. Other methods have been studied to produce $MoS_2$ including liquid phase deposition, liquid exfoliation, laser thinning, solid state reactions and hydrothermal methods but they take several preparation processes and are useful only for the production of composites and hybrid dispersions. So far, chemical vapor deposition has been demonstrated as the most practical method of synthesizing large-area and high quality graphene, boron nitride, and 2D TMDs nanosheets. A direct growth of $MoS_2$ monolayers can be achieved on various substrates by using the vapor-phase reaction of $MoO_3$ and S powders in a CVD system. Najmaei et. al. synthesized $MoS_2$ atomic layers on $Si/SiO_2$ substrates by using this method and reported an average mobility and maximum current on/off ratio of 4.3 $cm^2V^{-1}s^{-1}$ and ~$10^6$, respectively. However, the main concern of this method is the formation of $MoS_2$ monolayer crystal flakes on the substrates rather than the formation of a continuous $MoS_2$ layer and sometimes the reaction normally leads to $MoS_2$ nanoparticles or nanorod structures with formation of by products like $MoO_2$ during the synthesis. Zhan et al. grew large area $MoS_2$ films e-beam evaporation and CVD methods and found a p-type conduction but with very poor mobility in the range of 0.004-0.04 $cm^2V^{-1}s^{-1}$. Recently, Yu et al. developed a new method that precisely control the number of $MoS_2$ layers over a large area by using $MoC_{15}$ and sulfur as precursor materials in a CVD at high temperature. But the field-effect mobility of charge carriers in their device was found to be very low (0.003-0.03 $cm^2V^{-1}s^{-1}$). Furthermore the thickness modulated growth of $MoS_2$ thin layered structure has not been reported yet. In considering the theoretical estimation that the energy bandgap change of $MoS_2$ with thickness, it is therefore imperative to develop suitable deposition method for the growth of thickness modulated films while demonstrating high quality, uniform and continuous films over a large area exhibiting excellent electrical properties.

The present invention provides a design and fabrication method of micro-supercapacitors based on two-dimensional film (2D). 2D layered materials have been attracted as an efficient flexible energy storage for wearable electronics due to their unique structure.

The present invention provides a new approach of fabricating flexible and high-capacitance 2D supercapacitor electrode, transistor, capacitor, emitter, or detector fabricated directly by using direct-deposition technique. The fabricated 2D materials based electrode exhibits stable and strong adhesion to the substrate. The optimized supercapacitor shows an excellent capacitive behavior with a high capacitance and the volumetric power and energy density. This supercapacitor electrode also exhibited an excellent cyclic stability over along with a low equivalent series resistance (ESR) of only about few Ω. The flexible and high performance 2D materials-based supercapacitor bring new design opportunities for an efficiency wearable electronic devices.

The advent of the electronic device miniaturization and portable electronic devices has led to the development of microscale energy storage modules that can be integrated with these systems for prolonged and reliable operations. Micro-supercapacitors, in particular, have attracted significant attention for the development of next generation portable and wearable electronic devices, implantable medical devices, and remote sensors. In comparing currently available micro-batteries, micro-supercapacitors offer high power density (10 times higher than Li-ion batteries) for short times, longer life cycle (~106) and are less susceptible to overheating under high charge/discharge rates. Therefore, micro-supercapacitors have been attracted for replacing currently used power sources including batteries. The performance of electrode material plays a crucial role in the electrochemical evaluation of supercapacitors and the mechanism of charge storage classifies them into the categories of electric double layer capacitors (EDLC) and/or Faradic (pseudocapacitive) supercapacitors (FS). Activated carbon is the most commonly used electrode material in electric double-layer (EDL) supercapacitors due to its extremely large surface area. However, due to the non-uniformity of pore sizes, only a fraction of it reacts with the electrolyte ions and thereby limits the specific capacitance and energy density. Very recently, carbon nanomaterials such as carbon nanotubes (CNTs) and graphene have been studied for their application in electric double-layer capacitors (EDLC) based thin film supercapacitors.

The present invention is compatible to conventional semiconductor process and can be extended to other 2D materials and arbitrary substrates by transferring $MoS_2$ layers including flexible substrates for flexible electronic applications. The polarity of $MoS_2$ can be modulated by introducing surface functionality of substrate oxygen terminated surface for p-type semiconductor and K, Cl, Na for n-type semiconductor. The developed film can be extended to design novel devices such as field effect transistors (FETs), optical switch, flexible electronics, and lubricant coating. The 2D materials known as Transition metal dichalcogenides (TMDCs) are the group of hexagonal structured, van der Waals bonded, layered materials with the molecular formula $MX_2$ (where M=transition metals such as Mo, W, Nb, and X=chalcogens such as S, Se, Te). The TMDC materials exhibit strong in-plane bonding along with weak out-of-plane bonding, enabling the exfoliation of the materials into single crystal two-dimensional flakes with atomic level thickness. It has emerged recently that there are over 40 exotic layered materials which can be split into a single atom thick material, including molybdenum disulfide ($MoS_2$), molybdenum disilicide ($MoSe_2$), silicene, boron nitride (BN), tungsten disulfide ($WS_2$), $WSe_2$, germanene etc., and their hybrid-structures. Looking at these materials very closely, we observe that the consequences of their extraordinary properties are more dimension-dependent than size-dependent, hence creating a new area for research. Depending on their chemical composition and structural configurations, atomically thin 2-D materials can be metallic, semi-metallic, or semiconducting. In particular, some of the TMDC materials and their heterostructures have shown remarkable electronic and optoelectronic properties. For example, monolayer $MoS_2$ exhibits a direct intrinsic bandgap (~1.8 eV), acceptable mobility for transistor operation (~200 $cm^2V^{-1}s^{-1}$), and quantum confinement. In this context, the intrinsic semiconducting property of the 2-D $MoS_2$ structure is advantageous, since there is no need for doping or making super-narrow ribbons, as would be required to create a comparable energy band gap in graphene. Therefore, even at room temperature, 2-D $MoS_2$ based field effect transistors exhibit high current on/off ratios of $1\times10^8$ and ultra-low power dissipation, which will be highly advantageous for future electronics and opto-electronics.

FIGS. 1A-1D are images of designs of 2D materials based electrode for supercapacitors. FIG. 1A is an image of Type 1 having the 2D material deposited on a metal layer which is on a substrate. FIG. 1B is an image of Type 2 having the 2D material deposited on a substrate. FIG. 1C is an image of Type 3 having the 2D material deposited on a functionalized surface on a substrate. FIG. 1D is an image of Type 4 having the 2D material deposited on a flexible substrate.

Two dimensional (2D) transition metal dichalcogenide (TMD) materials are expected to show considerable charge storage capacity owing to their unique properties and direct applications in various energy storage devices. Molybdenum disulfide ($MoS_2$), in particular, can be a promising electrode material for effective energy storage due to its sheet like structure that is electrochemically active and is suitable for double layer charge storage as well as pseudo-capacitive charge transfer from the intercalation of electrolyte ions ($H^+$; $Li^+$) into the layered structure due to its different oxidation states (+2 to +6). There have been studies to fabricate $MoS_2$ thin films including exfoliation, and hydrothermal method. However the complexity in fabricating the clean interfaces using exfoliated 2D materials still remains an issue. The contaminants like water molecules, hydrocarbons are always trapped between the layers and it takes considerable efforts to make the clean interfaces. Besides this, an exfoliation method fails to control the thickness, size and uniformity of the 2D film which is not scalable for large-scale device fabrication. Furthermore, the 2D materials become structurally unstable when stacked into sheets by using exfoliation methods. Chemical vapor deposition (CVD) is the most promising method to synthesize monolayer $MoS_2$ these days; however it needs an additional step of film transport via chemical process.

Figure 2:
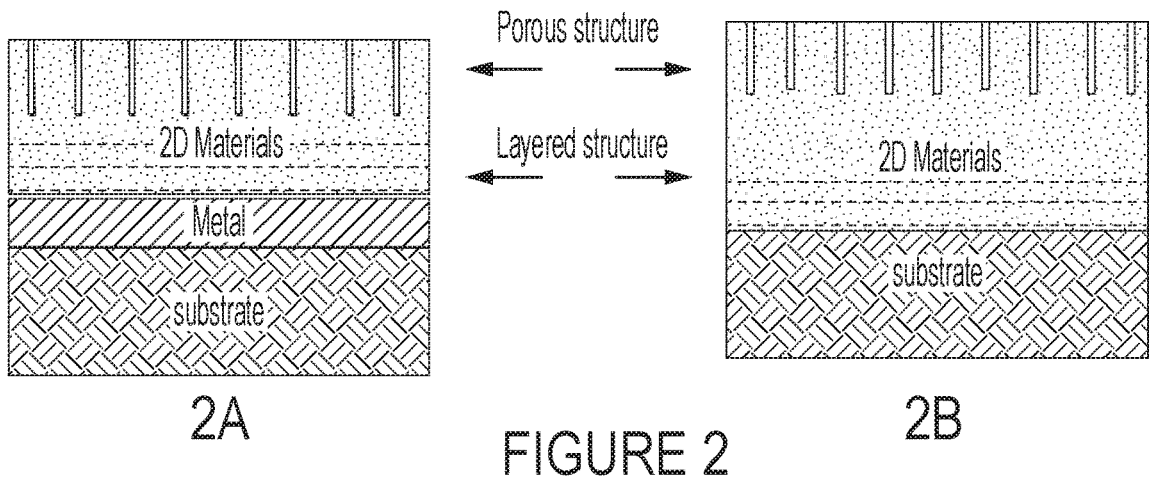
FIGS. 2A-2B are cross-sectional view images of 2D materials based electrode.

FIGS. 2A-2B are cross-sectional view images of 2D materials based electrode, showing the substrate and the layered structure.

Two methods have been developed for making 2D materials based electrode; two-step deposition method and direct deposition method. Two-step deposition method: The schematic explains the two-step method for supercapacitor electrode fabrication. In the two-step method, The first step involves the synthesis of metal (Mo, W, Ti) thin films at room temperature on substrates (Si, glass, quartz, polyimide, PET, etc.). The deposition time was varied from 4 sec to 180 sec to obtain a batch of Mo films with increasing thicknesses. The substrates were initially cleaned thoroughly with acetone in an ultrasonic bath followed by cleaning in ethanol, methanol and DI water. The substrates were fixed on the heater and chamber was evacuated to a vacuum level of $10^{-7}$ Torr. Before every sputtering run, the target was pre-sputtered for 5 min to ascertain the same state of Mo target for each sample. In the second step, magnetron sputtered $Si/SiO_2$/Mo films were subsequently placed in a low pressure chemical vapor deposition (LPCVD) system (Graphene Square CVD) equipped with a 4-inch diameter quartz tube furnace. A ceramic boat containing pure sulphur (~1 gm, Sigma Aldrich) was placed in the upstream of a quartz tube. Argon was used as a carrier gas to convey sulphur vapor species to the downstream Mo films. The tube was pumped down to a pressure of $10^{-3}$ Torr and flushed with Ar gas repeatedly to guarantee a favorable growth atmosphere. In the flow atmosphere of 200 sccm Ar with a chamber pressure of 5 Torr, the furnace was heated to 600° C. at the center zone in 30 min. After 60 min, the furnace was cooled down naturally to room temperature. The samples $S_1$, $S_2$, $S_3$, $S_4$ and $S_5$ corresponds to $MoS_2$ films converted for Mo films deposited at different sputtering times of 4, 10, 30, 60 and 180 sec, respectively.

Figure 3:
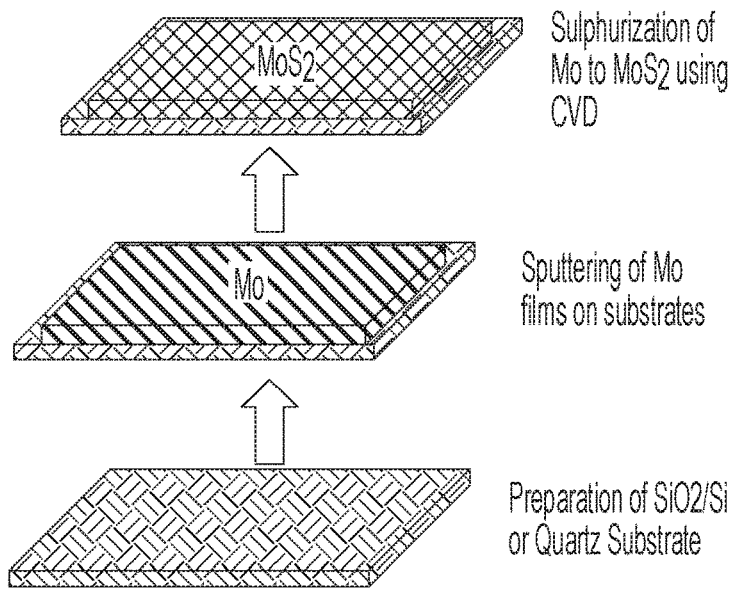
FIGS. 3A-3B are images of a two-step method, metal deposition and sulfurization, for fabricating 2D materials based electrode.
Figure 3:
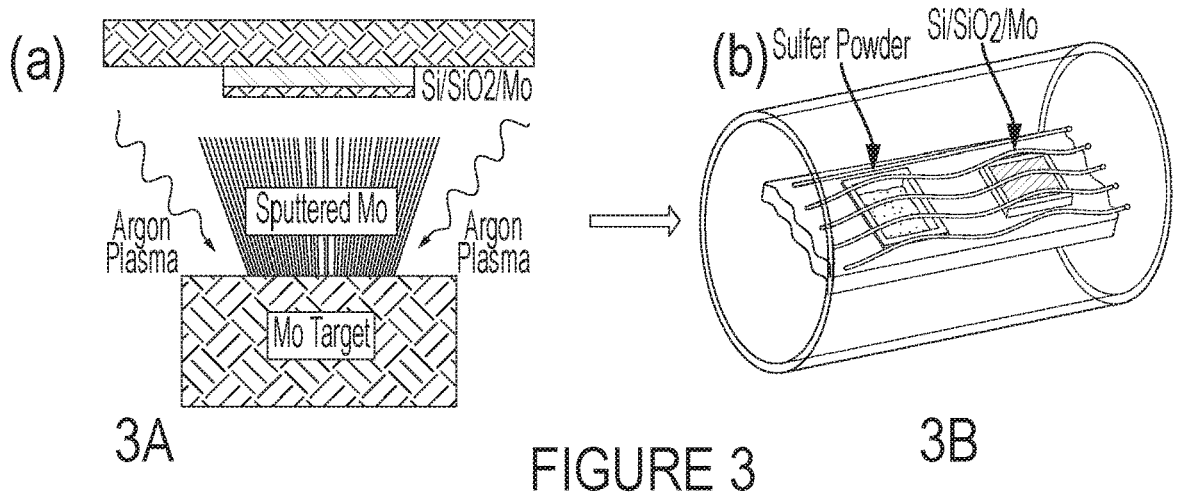

FIGS. 3A-3B are images of a two-step method, metal deposition and sulfurization, for fabricating two-dimensional materials based electrode. A substrate of $SiO_2$ or quartz is prepared. A Mo film is sputtered onto the substrate. The Mo is sulphurized into $MoS_2$ by CVD. FIG. 1A also shows the deposition of the Mo onto the Mo target in an Argon atmosphere. Direct deposition method: The schematic explaining the direct deposition method of depositing 2D materials. The copper foil was received from Alfa Aesar company (thickness-0.60 μm, 99.99% purity). For continuous films with large coverage, Cu foils (1 inch×1 inch) were thoroughly cleaned in acetic acid followed by acetone, isopropyl alcohol (IPA) and deionized water. $MoS_2$ thin films of different thicknesses were fabricated on Cu foils at 300° C. using magnetron sputtering technique. Circular disc of 2 inch diameter and 3-5 mm thick Molybdenum disulfide ($MoS_2$) (99.8% pure) was used as the target material for sputtering. The substrate was fixed onto a heater with the help of clips and silver paste for the fabrication of thin films. After mounting the substrates, the chamber was evacuated using a turbo molecular pump, backed by a rotary pump up to a high vacuum ($\leq 2\times 10^{-6}$ Torr). An inert gas (Argon~99.999% purity) was fed into the chamber via gas inlet valve. Sputtering of $MoS_2$ target starts when an rf power of 60 W was applied to the target material and $MoS_2$ films were consequently deposited on Cu foils under Ar plasma.

Figure 4:
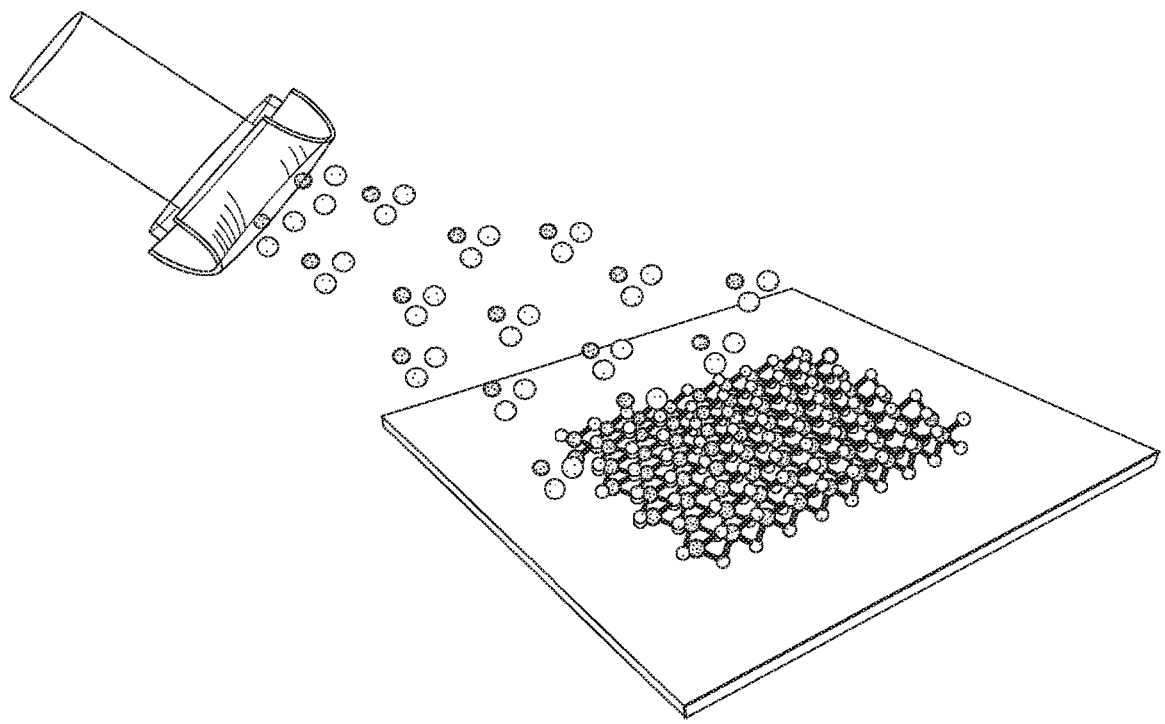
FIGS. 4A-4C shows a schematic illustration of direct-deposited MoS$_2$ thin films on copper (Cu) foils using magnetron sputtering technique. After a deposition time of 25 minutes, MoS$_2$ films (1.2 µm thick) were deposited on a large area (1.5×1.5 inch) Cu foils (FIG. 4B) with good uniformity.
Figure 4:
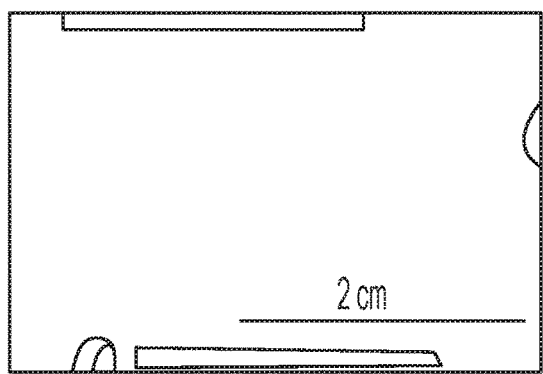
Figure 4:
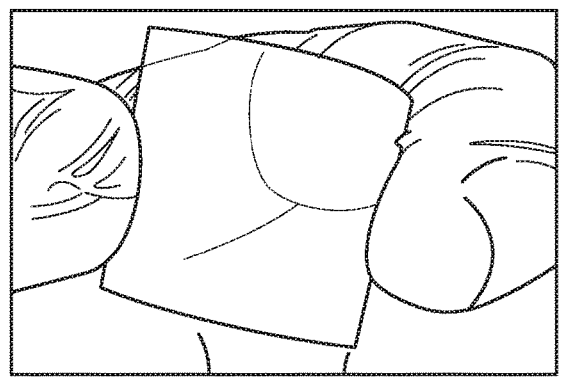

FIG. 4A shows a schematic illustration of direct-deposited $MoS_2$ thin films on copper (Cu) foils using magnetron sputtering technique. After a deposition time of 25 minutes, $MoS_2$ films (1.2 μm thick) were deposited on a large area (1.5×1.5 inch) Cu foils (FIG. 4B) with good uniformity. FIG. 4C shows the possibility of large area deposition of $MoS_2$ films on flexible (polyimide) substrates.

Figure 5:
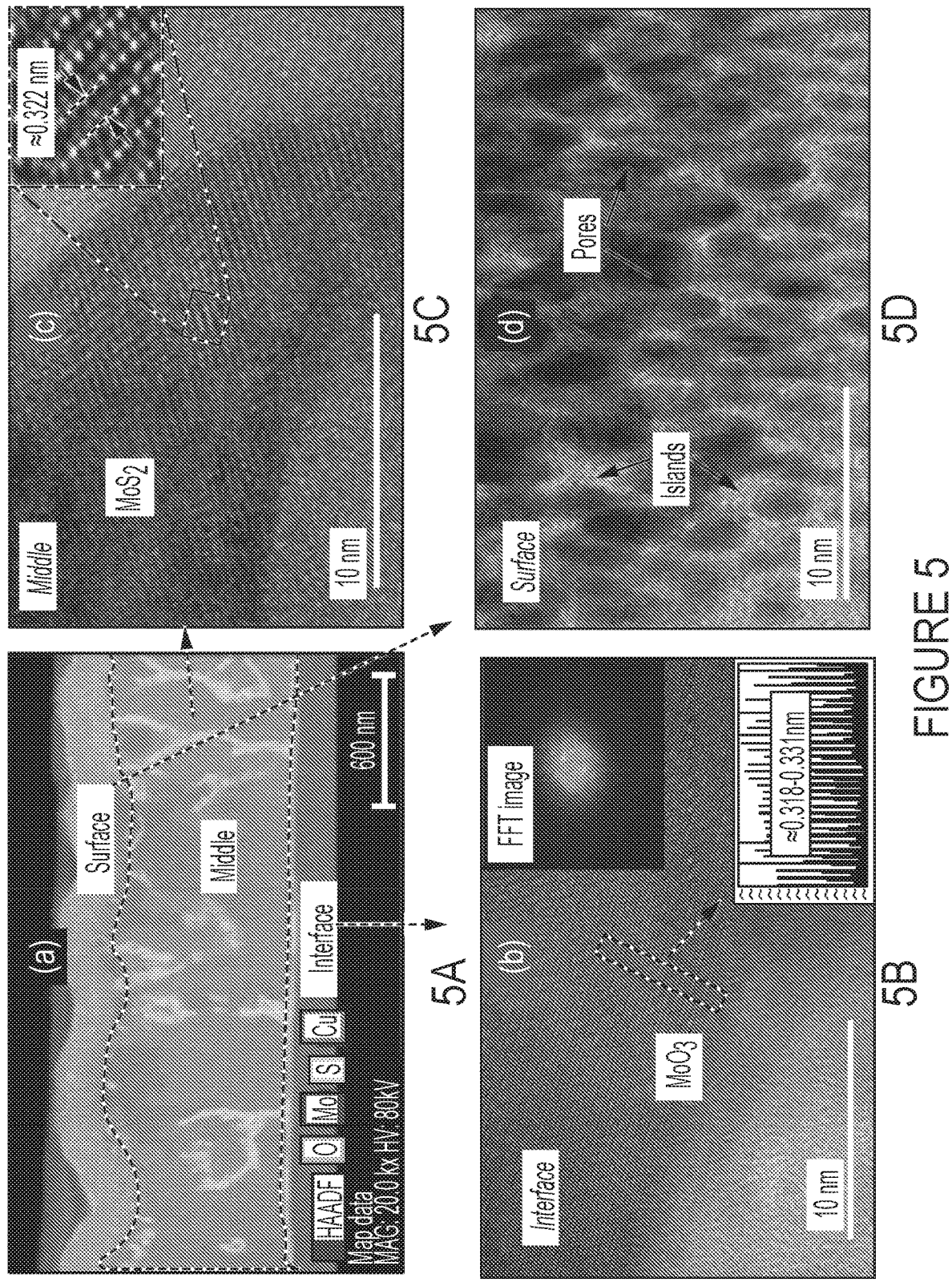
FIGS. 5A-5D show the high-angle annular dark-field imaging (HAADF) with EDS mapping of the cross-section of MoS$_2$ film confirming a thickness of about 1.2 µm.

FIGS. 5A-5D show the high-angle annular dark-field imaging (HAADF) with EDS mapping of the cross-section of $MoS_2$ film confirming a thickness of about 1.2 μm. FIG. 5A shows the high-angle annular dark-field imaging (HAADF) with EDS mapping of the cross-section of $MoS_2$ film confirming a thickness of about 1.2 μm. The cross-section EDS mapping clearly shows the spatial distribution of Mo, S, O, and Cu elements present in the $MoS_2$ film. The film was divided into three regions i.e., surface, middle and interface based on the structure and morphology across the $MoS_2$ film thickness. It is clear from FIG. 5B that a set of the layers lie parallel to the substrate with a d-spacing of ~0.331-0.381 nm, which is consistent with the previously reported results on $MoO_3$. Fast Fourier transform (FFT) image (inset of FIG. 5B) shows a well-ordered characteristic of $MoO_3$ layers at the interface. The formation of $MoO_3$ layers at the substrate-film interface could be due to the Mo bonding with oxygen atoms present at the surface of Cu substrate. The presence of an oxide layer ($MoO_3$) prior to $MoS_2$ formation is expected to promote a better adhesion and also serve as a barrier layer to prevent the sulfide formation on the Cu foil surface. With further increase in deposition time (FIG. 5C), the HRTEM image corresponding to the middle portion evidences the $MoS_2$ film growth with layer-to-layer spacing of ~0.621-0.664 nm. However, the $MoS_2$ growth shows a stacking disorder that can be referred to a turbostratic growth. The turbostratic growth is common in layered type materials where the stacking faults/disorder or defects are induced by the energetic bombardment of ions with the growing films. FIG. 5D is the HRTEM representative of the top surface of $MoS_2$ film suggesting the formation of an island structure with cavities. Since, the top surface of the $MoS_2$ film is critical for the electrochemical behavior because of the fact that the majority of capacitance through double layer formation will take place at its interface with electrolyte.

The electrochemical characterizations were performed in a three electrode system using 0.5M $H_2SO_4$ consisting of (a) $MoS_2$ thin film as working electrode (area-0.785 cm$^2$), (b) saturated Calomel reference electrode and (c) Platinum mesh as counter electrode. The current is measured between working and counter electrode, whereas voltage is computed between reference and working electrode. Cyclic voltammetry, Galvanostatic charge-discharge measurement and electrochemical impedance spectroscopy (EIS) were performed by a potentiostat (Bio-Logic Science Instruments-SP 300). The capacitance of the $MoS_2$ films was calculated from cyclic voltammetry (CV) and charge-discharge cycle by using the equation:

$$C_A = \frac{1}{Av\Delta V} \int I(V)dV \quad (1)$$

$$C_A = 2I\left(\frac{\Delta t}{A\Delta V}\right) \quad (2)$$

where I(V) is the response current, υ is scan rate, (I/A) is the applied current density (mA/cm$^2$), Δt is the discharge time (s), and ΔV is the discharge potential with subtracting Potential (IR) drop.

Volumetric energy (E) and volumetric power (P) densities were calculated by using equations;

$$E = \frac{0.5C\Delta V^2}{3600} \quad (3)$$

$$P = \frac{E(3600)}{\Delta t} \quad (4)$$

where, C is the volumetric capacitance (F/cm$^3$), ΔV is the operating voltage window, Δt is the discharge time. Apparent volume (product of height and area of active electrode) has been considered for the calculation of capacitance.

Figure 6:
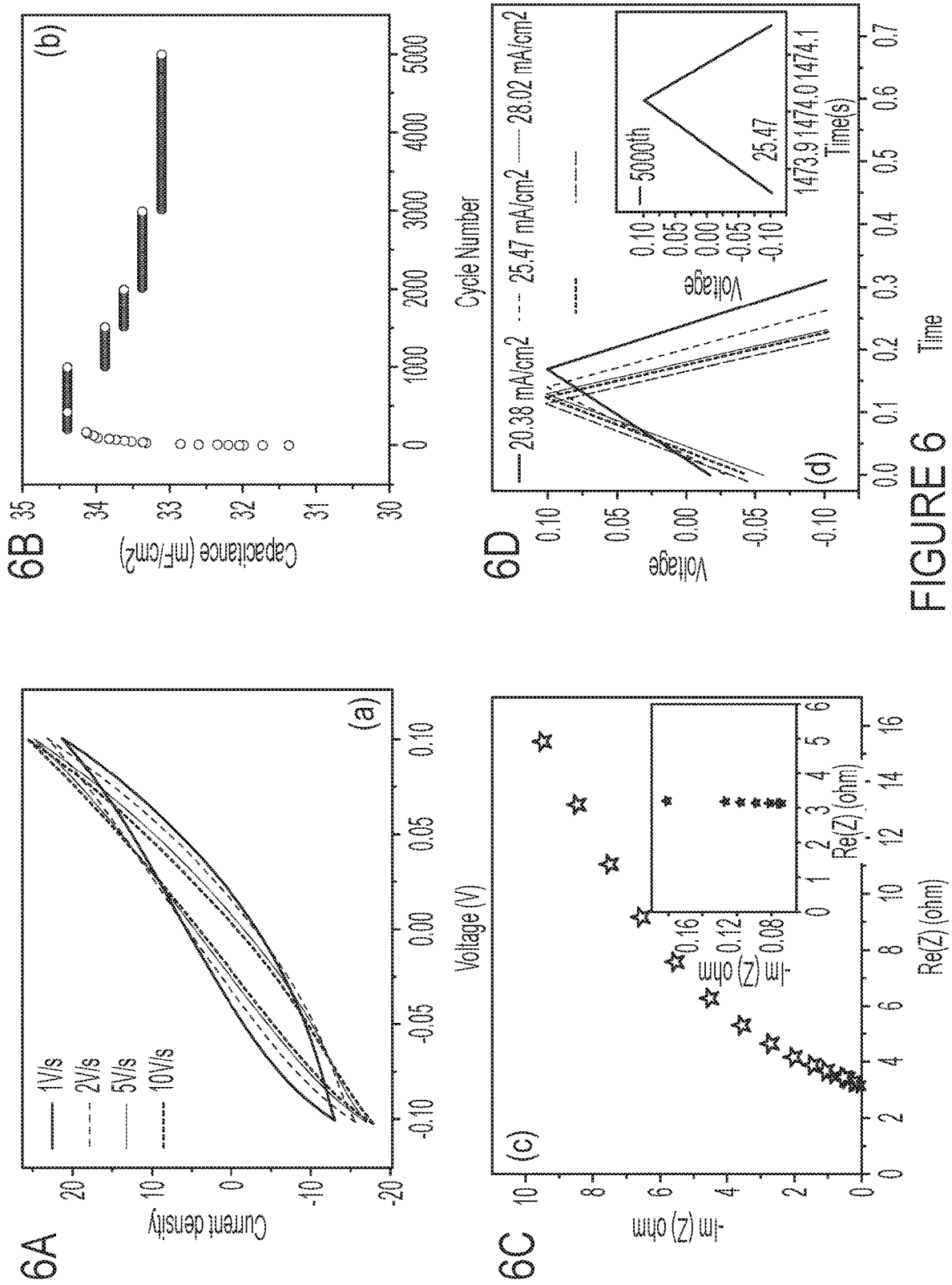
FIG. 6A is an image of a cyclic voltammetry performed in the voltage range of –0.1 to 0.1V in 0.5M H$_2$SO$_4$ at different scan rates.
FIGS. 6B-6D are plots of the variation of capacitance with cycle numbers up to 5000 cycles at current density of 25.47 mA/cm$^2$.

FIG. 6A is an image of a cyclic voltammetry performed in the voltage range of −0.1 to 0.1V in 0.5M $H_2SO_4$ at different scan rates. FIG. 6B is a plot of the variation of capacitance with cycle number up to 5000 cycles at current density of 25.47 mA/cm$^2$. FIG. 6C is an electrochemical impedance spectroscopy (EIS) image of $MoS_2$ thin film in the frequency range of 105 Hz to 0.1 Hz. Inset shows the high frequency region. FIG. 6D is an image of the charge-discharge profiles at different current density. Inset shows the 5000$^{th}$ cycle at a current density of 25.47 mA/cm$^2$.

The electrochemical performance of $MoS_2$ film as an active supercapacitor electrode was investigated using cyclic voltammetry (CV) and galvanostatic charge/discharge measurements in a three electrode system. FIG. 6A shows the CV results of Cu/$MoS_2$ electrode in a voltage range of −0.1 to +0.1V and at different scan rates ranging from 1V/s to 10V/s. It is observed that $MoS_2$ electrode exhibits elliptical (S-shape) CV curves at all scan rates without any redox peaks which is indicative of the presence of typical electrical double layer capacitance (EDLC) similar to previously reported results. However, a slight deviation from the rectangular shape infers the presence of a weak pseudocapacitive faradic charging due to the reversible redox reactions (i.e., change of Mo oxidation state from +4 to +3) arising from the intercalation of $H^+$ ions of the electrolyte in $MoS_2$. The absence of any peaks in the CV curves suggests that $MoS_2$ electrode has fast charge and discharge properties. FIG. 6B shows that our $MoS_2$ electrode yields a higher specific capacitance of 31.37-33.11 mF/cm$^2$ at a high current density of 25.47 mA/cm$^2$ compared to previously reported results on $MoS_2$ based electrodes and other materials like CNTs, graphene, PANI nanowire, and activated carbon electrodes having same order of thickness. The charge transfer characteristics of the electrode was also studied by means of electrochemical impedance spectroscopy (EIS) performed in the frequency range of 0.1 to $10^5$ Hz as presented in FIG. 6C. The x-intercept of the real axis in the high frequency region represents an equivalent series resistance (ESR) that encompasses electrolyte resistance, contact resistance at the interface between active material and substrate, and intrinsic resistance of active material. The ESR value extracted from FIG. 6C was only ~3.1Ω without the presence of any semi-circle and thereby facilitates the fast adsorption of ions favoring the double layer charge storage mechanism. Galvanostatic charge/discharge profiles were acquired at different current densities (20.38-38.21 mA/cm$^2$) as shown in FIG. 6D. It is clear from the graph that both curves display a linear and triangular characteristic showing the existence of combined EDLC-pseudocapacitance behavior. The existence of triangular curve without any indication of the voltage drop (IR drop) even after 5000 cycles (inset of FIG. 6D) confirms the dominance of EDLC mechanism over pseudocapacitance. Besides this, the specific capacitance was maintained up to 5000 cycles, showing a good cyclic stability. The stability of $MoS_2$ film at higher current densities allows them to be used for fast charging and discharging applications.

Figure 7:
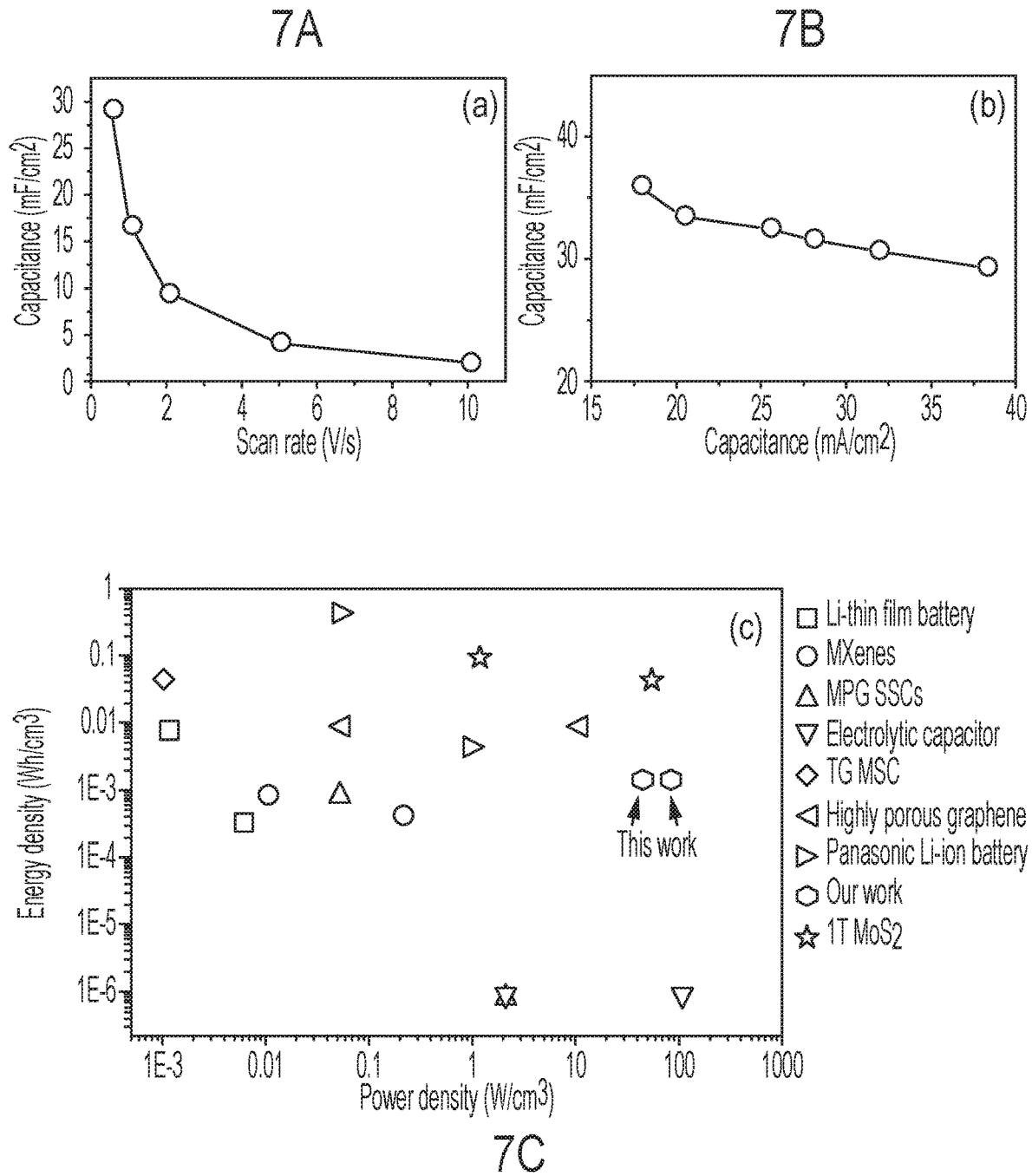
FIGS. 7A-7C are plots of the variation of capacitance with the (FIG. 7A) scan rate and (FIG. 7B) current density (FIG. 7C) energy and power density of MoS$_2$ supercapacitor electrode based on the area of the active.

FIGS. 7A-7C are plots of the variation of capacitance with the (FIG. 7A) scan rate and (FIG. 7B) current density (FIG. 7C) Energy and power density of $MoS_2$ supercapacitor electrode based on the area of the active. The $MoS_2$ electrode was further characterized to show its capacitance dependence on other parameters like scan rate and current density. FIG. 7A shows that the capacitance decreases gradually with increasing scan rate. It is obvious in nanostructured materials because the kinetics of ion transport and adsorption-desorption process becomes difficult at higher scan rates. However, the drop in the capacitance value from 29.7 mF/cm$^2$ at 1V/s to a reasonably good capacitance i.e., 2.079 mF/cm$^2$ at 10V/s indicates that $MoS_2$ supercapacitor electrode offers high ionic conductivity even at large scan rates which could be due to the larger anionic size of $S^{2-}$ ions as well as large surface area with a porous structure. Furthermore, the capacitance of the $MoS_2$ thin film was found to decrease with increasing current density as depicted in FIG. 7B. The observed trend in capacitance can be ascribed to the fact that there is inefficient ion accumulation at the electroactive surfaces at high current rates. FIG. 7C presents the Ragone plot of the volumetric power and volumetric energy densities of commonly used power sources like Lithium thin film batteries, graphene, Mxenes and are compared with our $MoS_2$ thin film electrodes. For 3 R phase $MoS_2$ electrode, the energy and power densities were calculated by using the equation (3) and (4). We found that the energy and power density were in the range of values 1.62-2.33 mWh/cm$^3$ and 40-80 W/cm$^3$, respectively. Remarkably, the power density up to ~80 W/cm$^3$ in our $MoS_2$ electrode is the highest among the reported values till date while the volumetric energy density is higher than the activated carbon electrodes (typically <1 mWh/cm$^3$) and are comparable to Li-ion thin film battery and conventional electrolytic capacitors.

Figure 8A:
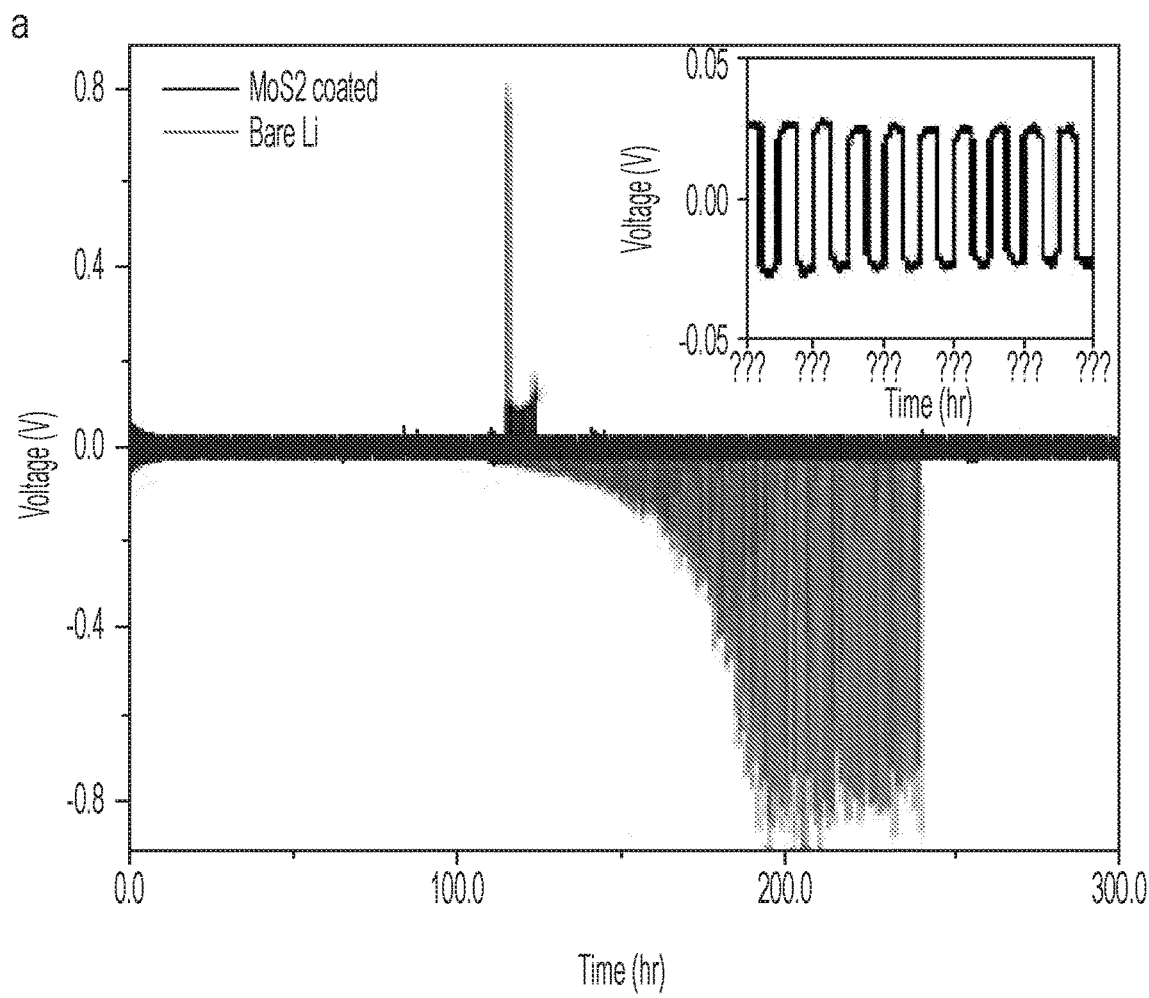
FIG. 8A is a graph showing a constant current charge/discharge voltage profile.
Figure 8B:
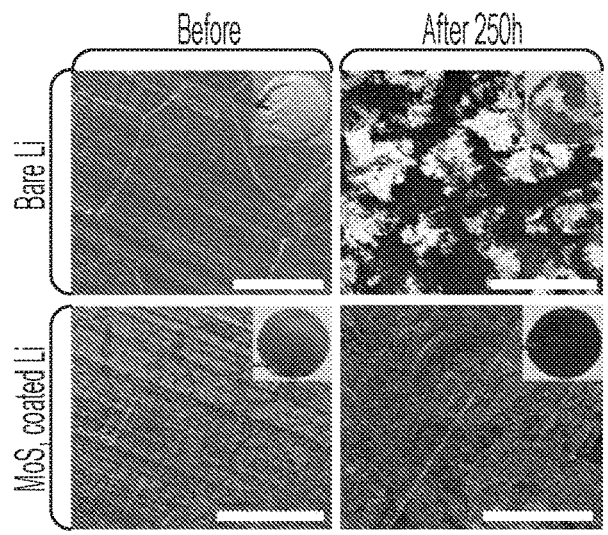
FIG. 8B shows digital images of the electrode.

FIGS. 8A and 8B show Li deposition/dissolution cyclic behavior between bare and $MoS_2$ coated Li symmetric cells. FIG. 8A is a graph showing a constant current charge/discharge voltage profile. Constant current charge/discharge voltage profiles for bare Li metal and MoS2 coated Li symmetric cells cycled at a current density of 10 mA cm$^{-2}$. The inset shows the magnified voltage profile for the $MoS_2$ coated Li symmetric cell. FIG. 8B shows SEM images of the electrode. SEM images showing the surface morphological changes between bare and MoS2 coated Li before and after 200 h of cycling at 10 mA cm$^2$ (scale bars, 100 μm), where the insets in FIG. 8B show the corresponding digital images of the electrodes.

Figure 9A:
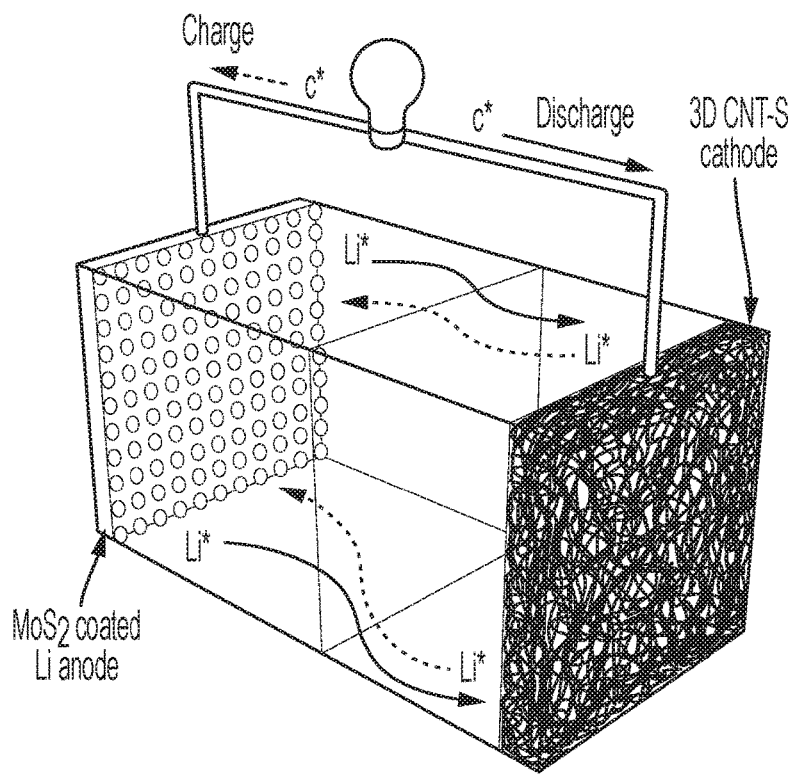
FIG. 9A is an image of a Li—S cell.
Figure 9B:
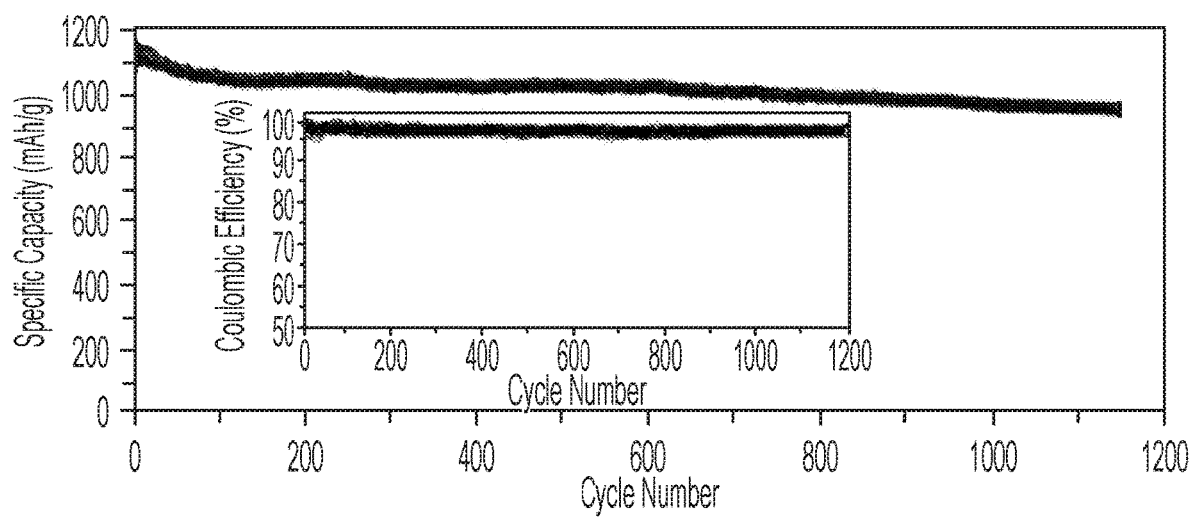
FIG. 9B is a graph of a cycling performance of the cell.

FIGS. 9A and 9B show the electrochemical Performance of Li-$MoS_2$/3D CNTs-S system. FIG. 9A is an image of a Li—S cell full cell configuration. FIG. 9B is a graph of a cycling performance of a Li/$MoS_2$—S cell measured at 0.5 C for 1200 cycles.

It is contemplated that any embodiment discussed in this specification can be implemented with respect to any method, kit, reagent, or composition of the invention, and vice versa. Furthermore, compositions of the invention can be used to achieve methods of the invention.

It will be understood that particular embodiments described herein are shown by way of illustration and not as limitations of the invention. The principal features of this invention can be employed in various embodiments without departing from the scope of the invention. Those skilled in the art will recognize, or be able to ascertain using no more than routine experimentation, numerous equivalents to the specific procedures described herein. Such equivalents are considered to be within the scope of this invention and are covered by the claims. The use of the word "a" or "an" when used in conjunction with the term "comprising" in the claims and/or the specification may mean "one," but it is also consistent with the meaning of "one or more," "at least one," and "one or more than one." The use of the term "or" in the claims is used to mean "and/or" unless explicitly indicated to refer to alternatives only or the alternatives are mutually exclusive, although the disclosure supports a definition that refers to only alternatives and "and/or." Throughout this application, the term "about" is used to indicate that a value includes the inherent variation of error for the device, the method being employed to determine the value, or the variation that exists among the study subjects.

As used in this specification and claim(s), the words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps. In embodiments of any of the compositions and methods provided herein, "comprising" may be replaced with "consisting essentially of" or "consisting of". As used herein, the phrase "consisting essentially of" requires the specified integer(s) or steps as well as those that do not materially affect the character or function of the claimed invention. As used herein, the term "consisting" is used to indicate the presence of the recited integer (e.g., a feature, an element, a characteristic, a property, a method/process step or a limitation) or group of integers (e.g., feature(s), element(s), characteristic(s), propertie(s), method/process steps or limitation(s)) only.

As used herein, words of approximation such as, without limitation, "about", "substantial" or "substantially" refers to a condition that when so modified is understood to not necessarily be absolute or perfect but would be considered close enough to those of ordinary skill in the art to warrant designating the condition as being present. The extent to which the description may vary will depend on how great a change can be instituted and still have one of ordinary skilled in the art recognize the modified feature as still having the required characteristics and capabilities of the unmodified feature. In general, but subject to the preceding discussion, a numerical value herein that is modified by a word of approximation such as "about" may vary from the stated value by at least ±1, 2, 3, 4, 5, 6, 7, 10, 12 or 15%.

All of the compositions and/or methods disclosed and claimed herein can be made and executed without undue experimentation in light of the present disclosure. While the compositions and methods of this invention have been described in terms of preferred embodiments, it will be apparent to those of skill in the art that variations may be applied to the compositions and/or methods and in the steps or in the sequence of steps of the method described herein without departing from the concept, spirit and scope of the invention. All such similar substitutes and modifications apparent to those skilled in the art are deemed to be within the spirit, scope and concept of the invention as defined by the appended claims.

What is claimed is:

1. A method of making a layered $MoS_2$ supercapacitor comprising the steps of:
   forming into a supercapacitor by:
   providing a substrate;
   providing a Molybdenum source;
   using a magnetron to induce a plasma to generate Molybdenum ions from the Molybdenum source;
   sputtering the Molybdenum ions on the substrate to form a thin layer of Molybdenum, wherein the thin layer of Molybdenum is configured as a top layer to the substrate;
   placing the substrate in a CVD chamber;
   providing a sulphur source;
   forming a sulphur vapor from the sulphur source, wherein the sulphur vapor is in communication with the CVD chamber; and
   sulphurizing the top layer of Molybdenum to form a thin layer of Molybdenum disulfide ($MoS_2$).

2. A method of making a thin layer transition metal dichalcogenide ($MX_2$) supercapacitor comprising the steps of:
   forming into a supercapacitor by:
   providing a substrate;
   providing a transition metal source;
   using a magnetron to induce a plasma to generate transition metal ions;
   sputtering the transition metal ions on the substrate to form a thin layer of transition metal, wherein the thin layer of transition metal is configured as a top layer to the substrate;
   placing the substrate in a CVD chamber;
   providing a chalcogen source;
   forming a chalcogen vapor from the chalcogen source in communication with the CVD chamber; and
   contacting the chalcogen vapor with the top layer of transition metal to form a thin layer transition metal dichalcogenide ($MX_2$).

3. The method of claim 2, wherein the transition metal is Mo, W, or Nb.

4. The method of claim 2, wherein the chalcogen is S, Se, or Te.

5. The method of claim 2, wherein the transition metal dichalcogenide is $MoS_2$, $MoSe_2$, $MoTe_2$, $WS_2$, $WSe_2$, $WTe_2$, $NbS_2$, $NbSe_2$, or $NbTe_2$.

6. The method of claim 2, wherein the thin layer of transition metal is 1, 2, 3, 4, 5, 6, 7, 8, 9, 10, 11, 12, 13, 14, 15, 16, 17, 18, 19, 20, 21, 22, 23, 24, 25, 26, 27, 28, 29, 30 or more layers thick.

7. The method of claim 2, wherein the transition metal dichalcogenide is 1, 2, 3, 4, 5, 6, 7, 8, 9, 10, 11, 12, 13, 14, 15, 16, 17, 18, 19, 20, 21, 22, 23, 24, 25, 26, 27, 28, 29, 30 or more layers thick.

8. The method of claim 2, further comprising the step of controlling one or more parameters of the magnetron to apply 2, 3, 4, 5, 6, 7, 8, 9, 10, 11, 12, 13, 14, 15, 16, 17, 18, 19, 20, 21, 22, 23, 24, 25, 26, 27, 28, 29, 30 or more layers of the transition metal.

9. The method of claim 2, further comprising the step of adding a second transition metal to form a second thin layer on the thin layer.

10. The method of claim 9, wherein the second transition metal is Mo, W, or Nb.

11. The method of claim 2, wherein the substrate is a $Si/SiO_2$ substrate.

12. The method of claim 2, wherein the magnetron uses a RF power source to creating a plasma.

13. The method of claim 2, wherein the temperature of the substrate is at a temperature of between room temperature −800° C.

14. A method of making a $MoS_2$ supercapacitor, comprising:
   providing a substrate;
   forming an electrode film on the substrate by:
      providing a Molybdenum source;
      using a magnetron to induce a plasma to generate Molybdenum ions from the Molybdenum source;
      sputtering the Molybdenum ions on the substrate to form a thin layer of Molybdenum, wherein the thin layer of Molybdenum is configured as a top layer to the substrate;
      placing the substrate in a CVD chamber;
      providing a sulphur source;
      forming a sulphur vapor from the sulphur source, wherein the sulphur vapor is in communication with the CVD chamber; and
      sulphurizing the top layer of Molybdenum to form a thin layer of Molybdenum disulfide $MoS_2$ on the substrate;
   forming a current collector on both sides of the electrode film;
   forming two separated electrodes by patterning the electrode film with an in-plane structure; and
   reinforcing a bonding portion of the electrode film and the current collector through metal plating.

15. The method of claim 14, further comprising supplying an electrolyte to the manufactured supercapacitor.

16. The method of claim 14, wherein one of a water-soluble electrolyte, an organic electrolyte, an ionic liquid electrolyte, and a solid electrolyte is used for the electrolyte.

17. The $MoS_2$ supercapacitor made by the process of claim 14.

* * * * *